US011393947B2

(12) United States Patent
Sun

(10) Patent No.: US 11,393,947 B2
(45) Date of Patent: Jul. 19, 2022

(54) METHOD OF FABRICATING LIGHT-EMITTING DIODE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yang Sun, Shenzhen (CN)

(*) Notice: Subject to any disclaimer, the term of this patent is extended or adjusted under 35 U.S.C. 154(b) by 347 days.

(21) Appl. No.: 16/625,725

(22) PCT Filed: Nov. 28, 2019

(86) PCT No.: PCT/CN2019/121558
§ 371 (c)(1),
(2) Date: Dec. 22, 2019

(87) PCT Pub. No.: WO2021/077538
PCT Pub. Date: Apr. 29, 2021

(65) Prior Publication Data
US 2021/0336076 A1    Oct. 28, 2021

(30) Foreign Application Priority Data
Oct. 21, 2019  (CN) .......................... 201910998188.6

(51) Int. Cl.
*H01L 21/30*   (2006.01)
*H01L 29/40*   (2006.01)
*H01L 33/00*   (2010.01)

(52) U.S. Cl.
CPC .... *H01L 33/0095* (2013.01); *H01L 2933/005* (2013.01); *H01L 2933/0016* (2013.01)

(58) Field of Classification Search
CPC ........................... H01L 33/0095; H01L 33/62
(Continued)

(56) References Cited

U.S. PATENT DOCUMENTS 7,491,580 B2 *  2/2009  Matsushima ....... H01L 27/1214
                                                        438/107
8,580,612 B2 * 11/2013  Theuss .................... H01L 25/50
                                                        438/109
(Continued)

FOREIGN PATENT DOCUMENTS

CN        1787234 A    6/2006
CN      102339916 A    2/2012
(Continued)

OTHER PUBLICATIONS

Inertial MEMS Principles and Practice Study on The Direct Bonding of ZnO/GaN ⌴ Journal of Electronic Materials ⌴ Jang, KB Room Temperature Bonding on Interface Between Metal and Ceramic Semiconductor technology.

*Primary Examiner* — Calvin Lee

(57) ABSTRACT

The present application provides a method of fabricating a light-emitting diode (LED) display panel, including the following steps: forming an LED substrate including a first substrate, an LED chip disposed on the first substrate, and a first electrode disposed on the LED chip; forming a driving substrate including a second substrate and a second electrode disposed on the second substrate; activating surfaces of the first electrode and the second electrode; aligning and pre-bonding the first electrode with the second electrode; and bonding the first electrode and the second electrode.

18 Claims, 3 Drawing Sheets

(58) Field of Classification Search
USPC ......... 257/625, 686, 777, 783; 438/108–109, 438/118, 406, 455
See application file for complete search history.

(56) References Cited

U.S. PATENT DOCUMENTS

| | | | |
|---|---|---|---|
| 10,971,472 B2 * | 4/2021 | Chen | ................. H01L 24/83 |
| 11,152,328 B2 * | 10/2021 | Ma | ................. B23K 3/047 |
| 2002/0090756 A1 | 7/2002 | Tago | |
| 2015/0021626 A1 | 1/2015 | Nakamura et al. | |
| 2018/0082977 A1 | 3/2018 | Yagyu | |
| 2018/0145220 A1 | 5/2018 | Zhong et al. | |
| 2019/0088633 A1 | 3/2019 | Tao et al. | |
| 2021/0015011 A1 * | 1/2021 | Chen | |
| 2021/0135042 A1 * | 5/2021 | Wei | ................. H01L 33/005 |

FOREIGN PATENT DOCUMENTS

| | | | | |
|---|---|---|---|---|
| CN | 102629656 A | 8/2012 | | |
| CN | 102931322 A | 2/2013 | | |
| CN | 103887377 A | 6/2014 | | |
| CN | 104992910 A | 10/2015 | | |
| CN | 105489727 A | 4/2016 | | |
| CN | 109802019 A | 5/2019 | | |
| JP | 2016201501 A | 12/2016 | | |
| WO | WO 2016/100657 A2 * | 6/2016 | ............. | H05B 37/00 |

\* cited by examiner forming a light-emitting diode (LED) substrate, including a first substrate, a light-emitting diode (LED) chip disposed on the first substrate, and a first electrode disposed on the LED chip; — S1 forming a driving substrate, including a second substrate and a second electrode disposed on the second substrate; — S2 activating surfaces of the first electrode and the second electrode; — S3 align and pre-bond the first electrode and the second electrode, and the first electrode and the second electrode in a one-to-one correspondence with each other; and — S4 bonding the first electrode and the second electrode. — S5

FIG. 1 providing the first substrate; — S11 disposing the LED chip on the first substrate; and — S12 providing the first electrode on the LED chip. — S13

METHOD OF FABRICATING LIGHT-EMITTING DIODE DISPLAY PANEL

BACKGROUND OF INVENTION

The present application claims priority to Chinese patent application no. 201910998188.6 submitted to Chinese Patent Office on Oct. 21, 2019, entitled "METHOD OF FABRICATING LIGHT-EMITTING DIODE DISPLAY PANEL", the entire contents of which are incorporated herein by reference.

FIELD OF INVENTION

The present application relates to a display technology, and particularly to a method of fabricating a light-emitting diode (LED) display panel.

DESCRIPTION OF PRIOR ART

Mirco-light-emitting diode (mirco-LED) technology mainly arranges LEDs with a size of several micrometers to several tens of micrometers in an array on a substrate, to form a high-density micro-sized LED array. However, current development of mirco-LED is restricted by several key technologies, including a light-emitting diode (LED) epitaxial wafer and chip, massive transfer of a chip, full color, substrate bonding, driving, defect detection, repair, and so on. However, at present, bonding between the chip and the substrate after the massive transfer is the bottleneck restricting achievement of yield improvement of the mirco-LED display technology.

Nowadays, mirco-LEDs are heated and soldered after completing the transfer and alignment, but the soldering process will damage the chip and the high temperature will harm the performance of the LED chip, seriously impacting the overall yield of the mirco-LED.

The embodiments of the present application provide a method of fabricating a light-emitting diode (LED) display panel, so as to solve the technical problems that the existing method of fabricating a light-emitting diode (LED) display panel damages the chip during the soldering process and harm the performance of the LED chip due to the high temperature.

SUMMARY OF INVENTION

An embodiment of the present application provides a method of fabricating a light-emitting diode (LED) display panel, including the following the steps:

forming an LED substrate including a first substrate, an LED chip disposed on the first substrate, and a first electrode disposed on the LED chip;

forming a driving substrate including a second substrate and a second electrode disposed on the second substrate;

activating surfaces of the first electrode and the second electrode;

aligning and pre-bonding the first electrode with the second electrode, the first electrode and the second electrode in a one-to-one correspondence with each other; and bonding the first electrode and the second electrode;

wherein the step of activating surfaces of the first electrode and the second electrode includes:

performing hydrophilic or hydrophobic treatment on the surfaces of the first electrode and the second electrode; and activating the surfaces of the first electrode and the second electrode by plasma; and the step of bonding the first electrode and the second electrode includes:

placing the pre-bonded LED substrate and driving substrate into a bonding system; and annealing the pre-bonded LED substrate and driving substrate to bond the first electrode and the second electrode.

In the method of fabricating the LED display panel of the present application, the surfaces of the first electrode and the second electrode are subjected to the hydrophilic treatment with a mixed solution.

In the method of fabricating the LED display panel of the present application, during the annealing, a temperature in the bonding system is lower than or equal to 400 degrees Celsius and greater than or equal to 150 degrees Celsius.

In the method of fabricating the LED display panel of the present application, the step of forming a driving substrate includes:

providing the second substrate;

forming the second electrode on the second substrate; and forming a patterned protective layer on the second substrate, wherein the protective layer covers the second substrate and exposes the second electrode.

In the method of fabricating the LED display panel of the present application, the protective layer has a height less than or equal to a height of the second electrode.

In the method of fabricating the LED display panel of the present application, the step of forming an LED substrate includes:

providing the first substrate;

disposing the LED chip on the first substrate; and disposing the first electrode on the LED chip.

In the method of fabricating the LED display panel of the present application, the step of disposing the LED chip on the first substrate includes:

grooving the first substrate to form a patterned groove;

disposing a colloid on a bottom surface of the groove; and adhering the LED chip to the colloid.

In the method of fabricating the LED display panel of the present application, the first electrode and the second electrode are aligned, pre-bonded, and bonded in vacuum or an atmospheric environment.

Another embodiment of the present application further provides a method of fabricating a light-emitting diode (LED) display panel, which includes the following the steps:

forming an LED substrate including a first substrate, an LED chip disposed on the first substrate, and a first electrode disposed on the LED chip;

forming a driving substrate including a second substrate and a second electrode disposed on the second substrate;

activating surfaces of the first electrode and the second electrode;

aligning and pre-bonding the first electrode with the second electrode, the first electrode and the second electrode in a one-to-one correspondence with each other; and bonding the first electrode and the second electrode.

In the method of fabricating the LED display panel of the present application, the step of activating surfaces of the first electrode and the second electrode includes:

performing hydrophilic or hydrophobic treatment on the surfaces of the first electrode and the second electrode; and activating the surfaces of the first electrode and the second electrode by plasma.

In the method of fabricating the LED display panel of the present application, the surfaces of the first electrode and the second electrode are subjected to the hydrophilic treatment with a mixed solution.

In the method of fabricating the LED display panel of the present application, the step of bonding the first electrode and the second electrode includes:

placing the pre-bonded LED substrate and driving substrate into a bonding system; and annealing the pre-bonded LED substrate and driving substrate to bond the first electrode and the second electrode.

In the method of fabricating the LED display panel of the present application, during the annealing, a temperature in the bonding system is lower than or equal to 400 degrees Celsius and greater than or equal to 150 degrees Celsius.

In the method of fabricating the LED display panel of the present application, the step of forming a driving substrate includes:

providing the second substrate;

forming the second electrode on the second substrate; and forming a patterned protective layer on the second substrate, wherein the protective layer covers the second substrate and exposes the second electrode.

In the method of fabricating the LED display panel of the present application, the protective layer has a height less than or equal to a height of the second electrode.

In the method of fabricating the LED display panel of the present application, the step of forming an LED substrate includes:

providing the first substrate;

disposing the LED chip on the first substrate; and disposing the first electrode on the LED chip.

In the method of fabricating the LED display panel of the present application, the step of disposing the LED chip on the first substrate includes:

grooving the first substrate to form a patterned groove;

disposing a colloid on a bottom surface of the groove; and adhering the LED chip to the colloid.

The method of fabricating a light-emitting diode (LED) display panel of the present application improves the surface tension and surface energy of the first electrode and the second electrode by performing plasma activation treatment on surfaces of the first electrode of the LED substrate and the second electrode of the driving substrate, thereby improving the surface adhesion and wettability of the first electrode and the second electrode after they are pre-aligned and bonded, which is beneficial to the process of metal interdiffusion of the surface of the first electrode and the second electrode, so that during the bonding process, the first electrode and the second electrode can be completely bonded merely by low-temperature annealing.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 1 is a schematic flowchart of a method of fabricating a light-emitting diode (LED) display panel according to an embodiment of the present application.

DETAILED DESCRIPTION OF PREFERRED EMBODIMENTS

Figures 2, 3:
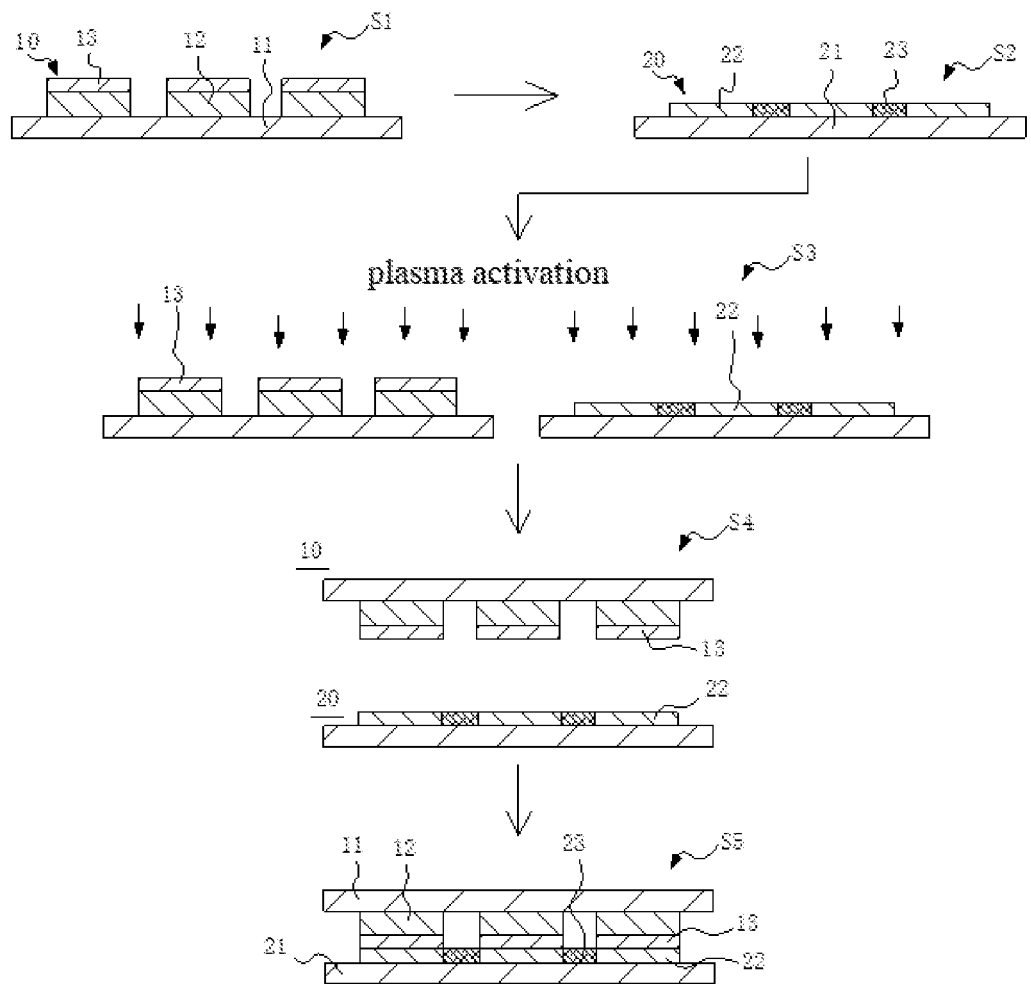
FIG. 2 is another schematic flowchart of a method of fabricating a light-emitting diode (LED) display panel according to an embodiment of the present application.
FIG. 3 is a schematic flowchart of the step S1 of a method of fabricating a light-emitting diode (LED) display panel according to an embodiment of the present application.

Please refer to the figures in the drawings, wherein the same reference symbols represent the same components. The following description is based on the exemplified specific embodiments of the present application, which should not be construed as limiting other specific embodiments that are not detailed herein.

Please refer to FIG. 1 and FIG. 2. FIG. 1 is a schematic flowchart of a method of fabricating a light-emitting diode (LED) display panel according to an embodiment of the present application. FIG. 2 is another schematic flowchart of a method of forming a light-emitting diode (LED) display panel according to an embodiment of the present application.

The method of fabricating the LED display panel in the embodiment of the present application includes the following the steps:

Step S1: forming a light-emitting diode (LED) substrate, including a first substrate, a light-emitting diode (LED) chip disposed on the first substrate, and a first electrode disposed on the LED chip;

Step S2: forming a driving substrate, including a second substrate and a second electrode disposed on the second substrate;

Step S3: activating surfaces of the first electrode and the second electrode;

Step S4: align and pre-bond the first electrode and the second electrode, and the first electrode and the second electrode in a one-to-one correspondence with each other; and Step S5: bonding the first electrode and the second electrode.

The method of fabricating a light-emitting diode (LED) display panel of the present application improves the surface tension and surface energy of the first electrode and the second electrode by performing plasma activation treatment on surfaces of the first electrode of the LED substrate and the second electrode of the driving substrate, thereby improving the surface adhesion and wettability of the first electrode and the second electrode after they are pre-aligned and bonded, which is beneficial to the process of metal interdiffusion of the surface of the first electrode and the second electrode, so that during the bonding process, the first electrode and the second electrode can be completely bonded merely by low-temperature annealing, which avoids the damage to the LED chip by high temperature bonding in the prior art.

For details of the method of fabricating the LED display panel of this embodiment, refer to the following description.

Step S1: forming an LED substrate 10, including a first substrate 11, a light-emitting diode (LED) chip 12 disposed on the first substrate 11, and a first electrode 13 disposed on the LED chip 12, wherein the step S1 and the step S2 may be performed in parallel and the sequences are not limited.

Specifically, referring to FIG. 3, the step S1 includes:

step S11: providing the first substrate 11;

step S12: disposing the LED chip 12 on the first substrate 11; and step S13: providing the first electrode 13 on the LED chip 12.

In the step S11, the first substrate 11 is a rigid substrate, such as a glass substrate, and the first substrate 11 may be a flat substrate or a substrate having a groove.

In the step S12, optionally, the LED chip 12 is a mirco-LED chip, but it is not limited thereto. A light-exiting surface of the LED chip 12 faces the first substrate 11, and an electrical connection surface of the LED chip 12 faces away from the first substrate 11. The LED chip 12 is disposed on the first substrate 11 through a colloid according to a set pixel arrangement pattern.

In the step S13, a first electrode 13 is provided on the electrical connection surface of the LED chip 12, so that the first electrode 13 and the LED chip 12 are electrically connected with each other.

In some embodiments, the step S12 includes: grooving the first substrate to form a patterned groove; then, disposing a colloid on a bottom surface of the groove; and finally, adhering the LED chip to the colloid.

The first substrate is provided with patterned grooves having an arrangement pattern in a one-to-one correspondence to the arrangement pattern of the LED chips 12. When the first electrode of the LED substrate and the second electrode of the driving substrate are aligned and pre-bonded, the LED chip 12 is disposed in the groove, thereby reducing a height of a gap between the first substrate and the second substrate. As a result, a thickness of the LED display panel can be reduced without removal of the first substrate, and interference on photometry can be reduced.

In some embodiments, the step S1 may also be performed by first forming the first electrode 13 on the LED chip 12 simultaneously during forming the LED chip 12, and then, fixing the LED chip 12 on the first substrate 11. This the step saves processes of the step 10 of forming the LED substrate and improves efficiency.

Then, turn to the step S2.

Step S2: forming the driving substrate 20, including a second substrate 21 and a second electrode 22 provided on the second substrate 21.

Figure 4:
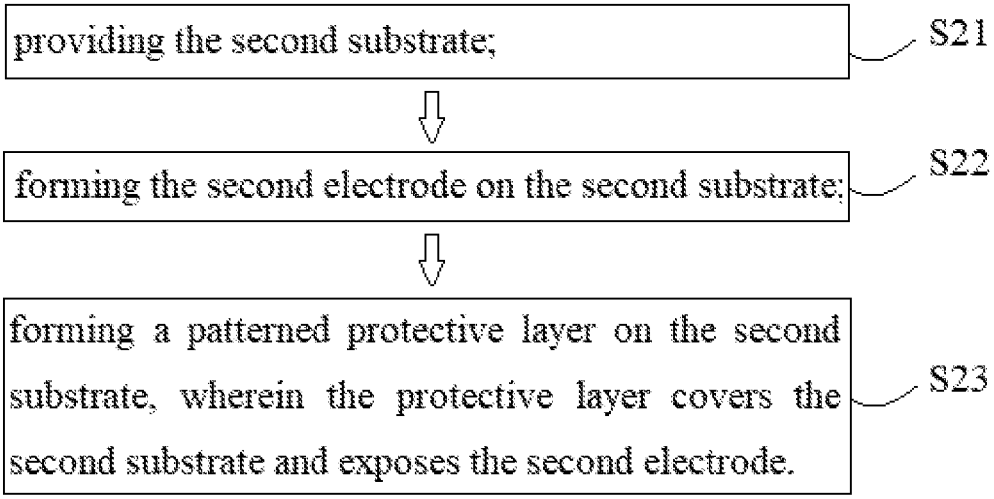
FIG. 4 is a schematic flowchart of the step S2 of a method of fabricating a light-emitting diode (LED) display panel according to an embodiment of the present application.

Specifically, referring to FIG. 4, the step S2 includes:

step S21: providing the second substrate 21;

step S22: forming the second electrode 22 on the second substrate 21; and step S23: forming a patterned protective layer 23 on the second substrate 21, wherein the protective layer 23 covers the second substrate 21 and exposes the second electrode 22.

In the step S21, the second substrate 21 is a rigid substrate, such as a glass substrate.

In the step S22, it should be noted first that a driving circuit for driving the LED chip 12 to emit light is already provided on the second substrate 21. The second electrode 22 is electrically connected to the driving circuit. The second electrodes 22 and the first electrodes 13 are in a one-to-one correspondence with each other.

In the step 23, the protective layer 23 can be prepared by photolithography, inkjet-printing, or sputtering of an inorganic layer. The protective layer 23 covers the driving circuit and exposes the second electrode 22. Since a chemical solution is likely to damage the driving circuit in the subsequent hydrophilic or hydrophobic treatment, a purpose of introduction of the protective layer 23 is to protect the driving circuit.

A height of the protective layer 23 is less than or equal to a height of the second electrode 22, which facilitates the aligning and pre-bonding of the first electrode 13 and the second electrode 22.

In some other embodiments, the height of the protective layer exceeds the second electrode and extends between the LED chips. That is, after the LED panel is bonded, the protective layer extends into a space between the LED chips and surrounds peripheral sides of the LED chips, resulting in mitigation of side light interference. Optionally, the protective layer may be made of a black resin-based plastic or other translucent plastic. Then, turn to the step S3.

Step S3: activating surfaces of the first electrode 13 and the second electrode 22.

Figure 5:
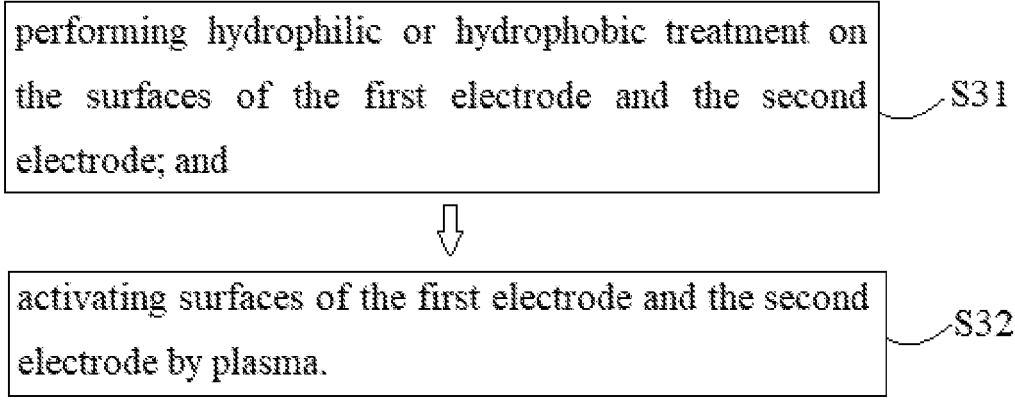
FIG. 5 is a schematic flowchart of the step S3 of a method of fabricating a light-emitting diode (LED) display panel according to an embodiment of the present application.

Specifically, referring to FIG. 5, the step S3 includes:

Step S31: performing hydrophilic or hydrophobic treatment on the surfaces of the first electrode 13 and the second electrode 22; and Step S32: activating surfaces of the first electrode 13 and the second electrode 22 by plasma.

In the step S31, when the surfaces of the first electrode 13 and the second electrode 22 are subjected to hydrophilic treatment, this embodiment treats the surfaces of the first electrode 13 and the second electrode 22 by using a mixed solution, which includes ammonia, hydrogen peroxide, and water.

When the surfaces of the first electrode 13 and the second electrode 22 are subjected to hydrophobic treatment, this embodiment treats the surfaces of the first electrode 13 and the second electrode 22 by chemical etching, which adopts a chemical solution which can be hydrofluoric acid, and adjusts a degree of corrosion by controlling a concentration of the hydrofluoric acid and an etching time.

In addition, the hydrophilic treatment and hydrophobic treatment also have the effect of cleaning the surfaces of the first electrode 13 and the second electrode 22, to remove some impurities on the surfaces of the first electrode 13 and the second electrode 22, such as oxides, dust, organic layers, etc., thus providing excellent conditions for the step S32 and improves the effect of surface activation.

In the step S32, after the step 31 is performed, the surfaces of the first electrode 13 and the second electrode 22 are activated by plasma, so that surface tension and wettability of the first electrode 13 and the second electrode 22 are improved. Furthermore, adhesion of the surfaces of the first electrode 13 and the second electrode 22 is improved.

Due to the improved adhesion of the surfaces of the first electrode 13 and the second electrode 22, after the pre-bonding treatment is performed directly after the alignment, mutual diffusion between the two electrodes during the bonding process is facilitated. During the bonding, a bonding temperature can be reduced, and it is not necessary to use a high temperature to perform preliminary interfusion of the first electrode 13 and the second electrode 22.

Then, turn to the step S4.

Step S4: aligning and pre-bonding the first electrode 13 and the second electrode 22, and the first electrode 13 and the second electrode 22 in a one-to-one correspondence with each other.

Specifically, the step of pre-bonding is to bond the first electrode 13 and the second electrode 22. The first electrode 13 and the second electrode 22 can be aligned and pre-bonded in vacuum or an atmospheric environment.

When operating in vacuum, the surfaces of the first electrode 13 and the second electrode 22 are prevented from being contaminated by dust, etc., ensuring cleanliness of the surfaces of the first electrode 13 and the second electrode 22, and improving the pre-bonding effect, while when operating in the atmospheric environment, costs and processes can be saved.

Then, turn to the step S5.

Step S5: bonding the first electrode 13 and the second electrode 22.

Figure 6:
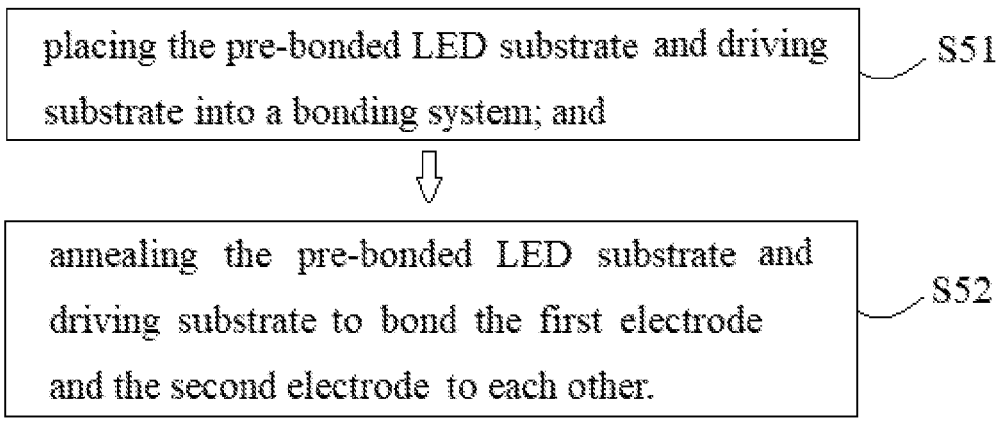
FIG. 6 is a schematic flowchart of the step S5 of a method of fabricating a light-emitting diode (LED) display panel according to an embodiment of the present application.

Specifically, referring to FIG. 6, the step S5 includes:

step S51: placing the pre-bonded LED substrate 10 and driving substrate 20 into a bonding system; and step S52: annealing the pre-bonded LED substrate 10 and driving substrate 20 to bond the first electrode 13 and the second electrode 22 to each other.

In the step S52, a temperature in the bonding system is lower than or equal to 400 degrees Celsius and greater than or equal to 150 degrees Celsius.

During annealing, materials of the first electrode 13 and the second electrode 22 diffuse and interfuse, and are firmly bonded together by metal bonds, covalent bonds, hydrogen bonds, Van der Waals forces, or atomic diffusion, with a high bonding strength.

Because the surfaces of the first electrode 13 and the second electrode 22 are activated, the first electrode 13 and the second electrode 22 can be pre-bonded. Therefore, during bonding, it is not necessary to melt the first electrode 13 and the second electrode 22 at a high temperature, so that the LED substrate 10 and the driving substrate 20 can be bonded at a low temperature, thereby preventing the LED chip 12 from being impacted by the high temperature.

When operating in vacuum, the surfaces of the first electrode 13 and the second electrode 22 are prevented from being contaminated by dust, etc., ensuring cleanliness of the surfaces of the first electrode 13 and the second electrode 22, and improving the pre-bonding effect, while when operating in the atmospheric environment, costs and processes can be saved.

In some embodiments, the method of fabricating the LED display panel of this embodiment further includes step S6: removing the first substrate.

As such, the process of the method of fabricating the LED display panel of this embodiment is completed.

Compared with the existing method of fabricating the LED display panel, the method of fabricating a light-emitting diode (LED) display panel of the present application improves the surface tension and surface energy of the first electrode and the second electrode by performing plasma activation treatment on surfaces of the first electrode of the LED substrate and the second electrode of the driving substrate, thereby improving the surface adhesion and wettability of the first electrode and the second electrode after they are pre-aligned and bonded, which is beneficial to the process of metal interdiffusion of the surface of the first electrode and the second electrode, so that during the bonding process, the first electrode and the second electrode can be completely bonded merely by low-temperature annealing, so as to solve the technical problems that the existing method of fabricating a light-emitting diode (LED) display panel damages the chip during the soldering process and harm the performance of the LED chip due to the high temperature.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method of fabricating a light-emitting diode (LED) display panel, comprising the following steps:
    forming an LED substrate comprising a first substrate, an LED chip disposed on the first substrate, and a first electrode disposed on the LED chip;
    forming a driving substrate comprising a second substrate and a second electrode disposed on the second substrate;
    activating surfaces of the first electrode and the second electrode by performing hydrophilic treatment on the surfaces of the first electrode and the second electrode;
    aligning and pre-bonding the first electrode with the second electrode, the first electrode and the second electrode in a one-to-one correspondence with each other; and
    bonding the first electrode and the second electrode.

2. The method of fabricating the LED display panel according to claim 1, wherein the first electrode and the second electrode are aligned, pre-bonded, and bonder in vacuum or an atmospheric environment.

3. The method of fabricating the LED display panel according to claim 1, wherein the step of bonding the first electrode and the second electrode comprises:
    placing the pre-bonded LED substrate and driving substrate into a bonding system; and
    annealing the pre-bonded LED substrate and driving substrate to bond the first electrode and the second electrode.

4. The method of fabricating the LED display panel according to claim 3, wherein during the annealing, a temperature in the bonding system is lower than or equal to 400 degrees Celsius and greater than or equal to 150 degrees Celsius.

5. The method of fabricating the LED display panel according to claim 1, wherein the step of activating surfaces of the first electrode and the second electrode further comprises activating the surfaces of the first electrode and the second electrode by plasma.

6. The method of fabricating the LED display panel according to claim 5, wherein the surfaces of the first electrode and the second electrode are subjected to the hydrophilic treatment with a mixed solution.

7. The method of fabricating the LED display panel according to claim 1, wherein the step of forming a driving substrate comprises:
    providing the second substrate;
    forming the second electrode on the second substrate; and
    forming a patterned protective layer on the second substrate, wherein the protective layer covers the second substrate and exposes the second electrode.

8. The method of fabricating the LED display panel according to claim 7, wherein the protective layer has a height less than or equal to a height of the second electrode.

9. The method of fabricating the LED display panel according to claim 1, wherein the step of forming an LED substrate comprises:
    providing the first substrate;
    disposing the LED chip on the first substrate; and
    disposing the first electrode on the LED chip.

10. The method of fabricating the LED display panel according to claim 1 wherein the step of disposing the LED chip on the first substrate comprises:
    grooving the first substrate to form a patterned groove;
    disposing a colloid on a bottom surface of the groove; and
    adhering the LED chip to the colloid.

11. A method of fabricating a light-emitting diode (LED) display panel, comprising the following steps:
- forming an LED substrate comprising a first substrate, an LED chip disposed on the first substrate, and a first electrode disposed on the LED chip;
- forming a driving substrate comprising a second substrate and a second electrode disposed on the second substrate;
- activating surfaces of the first electrode and the second electrode;
- aligning and pre-bonding the first electrode with the second electrode, the first electrode and the second electrode in a one-to-one correspondence with each other; and
- bonding the first electrode and the second electrode;
- wherein the step of activating surfaces of the first electrode and the second electrode comprises:
- performing hydrophilic or hydrophobic treatment on the surfaces of the first electrode and the second electrode; and
- activating the surfaces of the first electrode and the second electrode by plasma; and
- the step of bonding the first electrode and the second electrode comprises:
- placing the pre-bonded LED substrate and driving substrate into a bonding system; and
- annealing the pre-bonded LED substrate and driving substrate to bond the first electrode and the second electrode.

12. The method of fabricating the LED display panel according to claim 11, wherein during the annealing, a temperature in the bonding system is lower than or equal to 400 degrees Celsius and greater than or equal to 150 degrees Celsius.

13. The method of fabricating the LED display panel according to claim 11, wherein the surfaces of the first electrode and the second electrode are subjected to the hydrophilic treatment with a mixed solution.

14. The method of fabricating the LED display panel according to claim 11, wherein the first electrode and the second electrode are aligned, pre-bonded, and bonded in vacuum or an atmospheric environment.

15. The method of fabricating the LED display panel according to claim 11, wherein the step of forming a driving substrate comprises:
- providing the second substrate;
- forming the second electrode on the second substrate; and
- forming a patterned protective layer on the second substrate, wherein the protective layer covers the second substrate and exposes the second electrode.

16. The method of fabricating the LED display panel according to claim 15, wherein the protective layer has a height less than or equal to a height of the second electrode.

17. The method of fabricating the LED display panel according to claim 11, wherein the step of forming an LED substrate comprises:
- providing the first substrate;
- disposing the LED chip on the first substrate; and
- disposing the first electrode on the LED chip.

18. The method of fabricating the LED display panel according to claim 17, wherein the step of disposing the LED chip on the first substrate comprises:
- grooving the first substrate to form a patterned groove;
- disposing a colloid on a bottom surface of the groove; and
- adhering the LED chip to the colloid.

\* \* \* \* \*